(12) United States Patent
Takai et al.

(10) Patent No.: US 11,199,670 B2
(45) Date of Patent: Dec. 14, 2021

(54) TRANSCEIVER MODULE ASSEMBLY HAVING STOPPER POSITIONING

(71) Applicant: YAMAICHI ELECTRONICS CO., LTD., Tokyo (JP)

(72) Inventors: Yosuke Takai, Sakura (JP); Toshiyasu Ito, Togane (JP)

(73) Assignee: YAMAICHI ELECTRONICS CO., LTD., Tokyo (JP)

( * ) Notice: Subject to any disclaimer, the term of this patent is extended or adjusted under 35 U.S.C. 154(b) by 0 days.

(21) Appl. No.: 16/150,708

(22) Filed: Oct. 3, 2018

(65) Prior Publication Data

US 2019/0285817 A1   Sep. 19, 2019

Related U.S. Application Data

(60) Provisional application No. 62/642,237, filed on Mar. 13, 2018.

(51) Int. Cl.
| | |
|---|---|
| *G02B 6/42* | (2006.01) |
| *H01R 12/72* | (2011.01) |
| *H01R 13/6581* | (2011.01) |
| *H05K 9/00* | (2006.01) |
| *H01R 12/70* | (2011.01) |
| *H01R 12/71* | (2011.01) |

(52) U.S. Cl.
CPC ......... *G02B 6/4277* (2013.01); *G02B 6/4245* (2013.01); *G02B 6/4269* (2013.01); *G02B 6/4284* (2013.01); *H01R 12/7005* (2013.01); *H01R 12/72* (2013.01); *H01R 13/6581* (2013.01); *H05K 9/0058* (2013.01); *G02B 6/428* (2013.01); *H01R 12/714* (2013.01)

(58) Field of Classification Search
CPC .. G02B 6/4277; G02B 6/4284; G02B 6/4245; G02B 6/4269; G02B 6/428; H01R 12/7005; H01R 12/72; H01R 12/714; H01R 13/6581; H05K 9/0058
See application file for complete search history.

(56) References Cited

U.S. PATENT DOCUMENTS

| | | | |
|---|---|---|---|
| 6,893,293 B2 * | 5/2005 | Ice | G02B 6/4277 439/607.2 |
| 6,986,679 B1 * | 1/2006 | Aronson | H01R 25/00 439/170 |

(Continued)

FOREIGN PATENT DOCUMENTS

WO      2016/199831 A1    12/2016

OTHER PUBLICATIONS

Reference number list for U.S. Patent Application Publication No. 2013/0251314 of Ito et al. (Ito) (Year: 2021).*

(Continued)

*Primary Examiner* — Andrew Jordan
(74) *Attorney, Agent, or Firm* — Studebaker & Brackett PC

(57) ABSTRACT

A length of a protection wall, which is greater than a length of projection of a connecting end portion of a plug connector from opening end portions of an upper case as well as a lower case of an optical module, is set to be smaller than an interval between a contact surface of each of lower stopper pieces of a receptacle cage to come into contact with an end surface of a side wall as well as an end surface of an end surface of the lower case and an opening end surface of a slot of a host connector.

4 Claims, 11 Drawing Sheets

(56) References Cited

U.S. PATENT DOCUMENTS

| | | | | |
|---|---|---|---|---|
| 7,566,246 B2* | 7/2009 | Moore | ................ | G02B 6/4201 439/607.01 |
| 7,794,241 B2* | 9/2010 | Bright | ................ | H01R 12/721 439/59 |
| 7,824,113 B2* | 11/2010 | Wong | ................ | G02B 6/387 385/53 |
| 8,100,588 B2* | 1/2012 | Wong | ................ | G02B 6/387 385/53 |
| 8,770,864 B2* | 7/2014 | Ito | ................ | G02B 6/36 385/88 |
| 9,325,418 B2* | 4/2016 | Kuroda | ................ | G02B 6/4201 |
| 10,547,133 B1* | 1/2020 | Consoli | ................ | H01R 12/72 |
| 2004/0203289 A1* | 10/2004 | Ice | ................ | H01R 13/6596 439/607.2 |
| 2008/0207039 A1* | 8/2008 | Moore | ................ | G02B 6/4201 439/346 |
| 2009/0188106 A1* | 7/2009 | Wang | ................ | G02B 6/4292 29/764 |
| 2010/0178783 A1* | 7/2010 | Bright | ................ | H01R 12/721 439/79 |
| 2010/0178807 A1* | 7/2010 | Hashimoto | ................ | H01R 13/2464 439/630 |
| 2011/0019998 A1* | 1/2011 | Wong | ................ | G02B 6/387 398/41 |
| 2011/0229093 A1* | 9/2011 | McColloch | ................ | G02B 6/4246 385/92 |
| 2012/0108091 A1* | 5/2012 | Takai | ................ | G06K 7/0043 439/153 |
| 2013/0251314 A1* | 9/2013 | Ito | ................ | G02B 6/36 385/88 |
| 2018/0284373 A1* | 10/2018 | Lin | ................ | G02B 6/4277 |
| 2019/0285817 A1* | 9/2019 | Takai | ................ | G02B 6/4277 |
| 2020/0142143 A1* | 5/2020 | Takai | ................ | G02B 6/4284 |

OTHER PUBLICATIONS

Reference number list for U.S. Patent Application Publication No. 2008/0207039 of Moore et al. (Moore) (Year: 2021).*

Reference number list for U.S. Patent Application Publication No. 2004/0203289 of Ice et al. (Ice) (Year: 2021).*

Reference number list for U.S. Patent Application Publication No. 2019/0285817 of TAKAI et al. (TAKAI, the present application) (Year: 2021).*

* cited by examiner

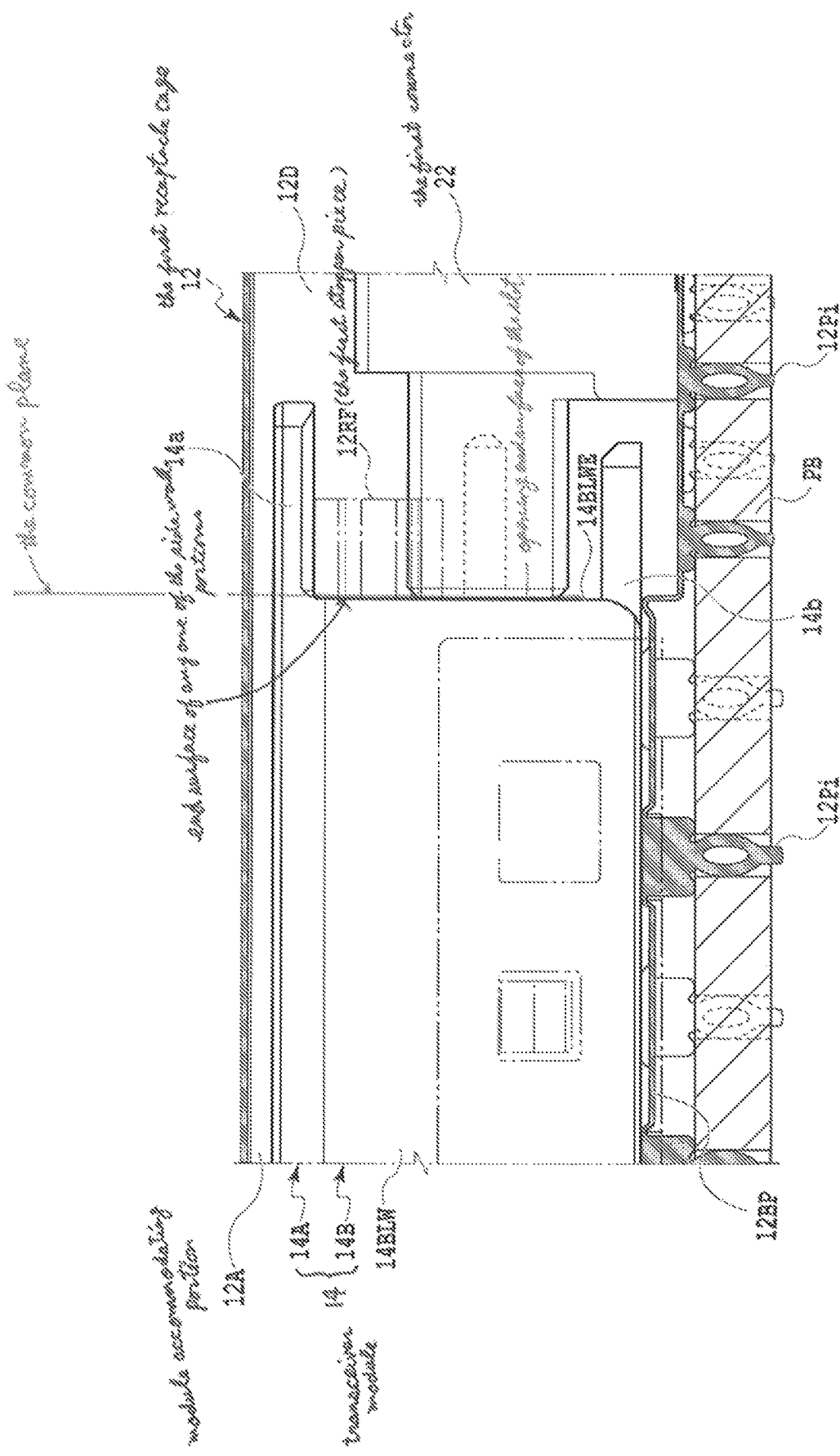

TRANSCEIVER MODULE ASSEMBLY HAVING STOPPER POSITIONING

CROSS REFERENCE TO RELATED APPLICATIONS

This application claims the benefit of U.S. Provisional Patent Application No. 62/642,237 filed Mar. 13, 2018, which is hereby incorporated by reference herein in its entirety.

BACKGROUND OF THE INVENTION

Field of the Invention

The present invention relates to a transceiver module assembly.

Description of the Related Art

In an optical communication system, a transceiver module assembly has been in practical use in order to transmit an optical signal transmitted through optical fibers or a copper cable as well as an optical connector and the like to a mother board. As shown in International Publication No. WO2016/199831, for example, such a transceiver module assembly comprises an optical module and an optical module receptacle assembly.

The optical module as a transceiver module comprises, as its main constituents: an upper case and a lower case made of a metal and collectively forming a contour portion; and a module board to be positioned at a predetermined position in an accommodating space defined between the upper case and the lower case.

A protection wall in thin sheets being continuous with an upper surface of the upper case and projecting in a longitudinal direction is formed at one end portion of the upper case. In addition, a pair of grooves each having a predetermined length and being engageable with stopper pieces of an optical module receptacle to be described later, respectively, are formed at one end portion of the upper surface of the upper case with a given interval.

The optical module receptacle assembly comprises, as its main constituents: a receptacle cage provided on a printed wiring board and configured to attachably and detachably accommodate the above-described optical module; and a host connector to be accommodated in a host connector accommodating portion of the receptacle cage. A pair of stopper pieces each having a substantially L-shaped cross-section are integrally formed at predetermined positions on inner peripheral surfaces of side walls, respectively, which form a module accommodating portion of the receptacle cage. When a plug connector of the optical module is connected to the host connector, the pair of stopper pieces are inserted into the above-mentioned pair of grooves in the optical module.

In the above-described configuration, when the plug connector of the optical module in a normal attitude is connected to contact terminals in a slot of the host connector through a module slot of the receptacle cage, after the above-mentioned stopper pieces of the receptacle cage are inserted into the corresponding grooves in the optical module, respectively, closed ends of the grooves reach and come into contact with the stopper pieces. Hereby, the inserted optical module is held at a predetermined position.

In such transceiver module assemblies, low-profile transceiver modules and receptacle cages have been developed one after another in recent years in order to arrange as many modules and cages as possible on the entire operating side end surface of a casing of an optical communication system.

SUMMARY OF THE INVENTION

Because more low-profile transceiver modules and receptacle cages seemingly have very small differences in dimension from former transceiver modules and receptacle cages, a new more low-profile transceiver module may be erroneously inserted into a former incompatible receptacle cage that is larger in size. In this case, there is a risk that the host connector in the receptacle cage is damaged by the erroneously inserted transceiver module. In case a module board of the transceiver module is connected to the host connector, there is a risk that the transceiver module suffers a breakdown because the transceiver module is likely to be supported unstably in the incompatible receptacle cage.

In view of the above-described problem, the present invention aims to provide a transceiver module assembly. The present invention can connect a transceiver module to a host connector in an appropriate receptacle cage, and prevent the transceiver module from being erroneously connected to a host connector in an incompatible and inappropriate receptacle cage.

To achieve the above-described object, a transceiver module assembly according to the present invention includes: a transceiver module including a module board, and a housing including at least a pair of side wall portions to define an accommodating space to accommodate the module board; and a first receptacle cage including a first connector connected to a connecting end portion of the module board of the transceiver module, a module accommodating portion having a module slot provided at one end to allow passage of the transceiver module and attachably and detachably accommodating the transceiver module, a connector accommodating portion communicating with the module accommodating portion and accommodating the first connector, and a first stopper piece provided in the module accommodating portion, the first stopper piece for restricting the transceiver module to a predetermined position by coming into contact with an end surface of any one of the side wall portions of the housing of the inserted transceiver module. Wherein, in a case where the transceiver module is inserted into a module accommodating portion of a second receptacle cage being different from the first receptacle cage, when movement of the transceiver module is restricted by a second stopper piece provided in the second receptacle cage and restricting the transceiver module to a predetermined position by coming into contact with the end surface of any one of the side wall portions of the housing of the inserted transceiver module, an amount of projection of the connecting end portion of the module board projecting from the housing of the transceiver module is set to be smaller than a distance between a peripheral edge of a slot of a second connector provided in the second receptacle cage and the second stopper piece.

In addition, the first receptacle cage may include a positioning piece for coming into contact with a tip end of a protection wall of the transceiver module and restricting an insertion operation of the transceiver module when the transceiver module in a second attitude being a direction reversed from a first attitude of the transceiver module is inserted into the module accommodating portion of the first receptacle cage. In addition, the second stopper piece of the second receptacle cage may restrict the movement of the transceiver module when the transceiver module in the second attitude being the direction reversed from the first attitude of the transceiver module is inserted into the module accommodating portion of the second receptacle cage.

According to the transceiver module assembly of the present invention, in the case where the transceiver module is inserted into the module accommodating portion of the second receptacle cage being different from the first receptacle cage, when the movement of the transceiver module is restricted by the second stopper piece provided in the second receptacle cage and restricting the transceiver module to the predetermined position by coming into contact with the end surface of any one of the side wall portion of the housing of the transceiver module, an amount of projection of the connecting end portion of the module board projecting from the housing of the transceiver module is set to be smaller than the distance between the peripheral edge of the slot of the second connector provided in the second receptacle cage and the second stopper piece. Thus, the transceiver module can be connected to the host connector in an appropriate receptacle cage and the transceiver module can also be kept from being erroneously connected to a host connector in an inappropriate receptacle cage which is incompatible therewith.

Further features of the present invention will become apparent from the following description of exemplary embodiments with reference to the attached drawings.

BRIEF DESCRIPTION OF THE DRAWINGS

FIG. 3 is a partial cross-sectional view showing an enlarged part illustrated in FIG. 2B;

DESCRIPTION OF THE EMBODIMENTS

Figure 2A:
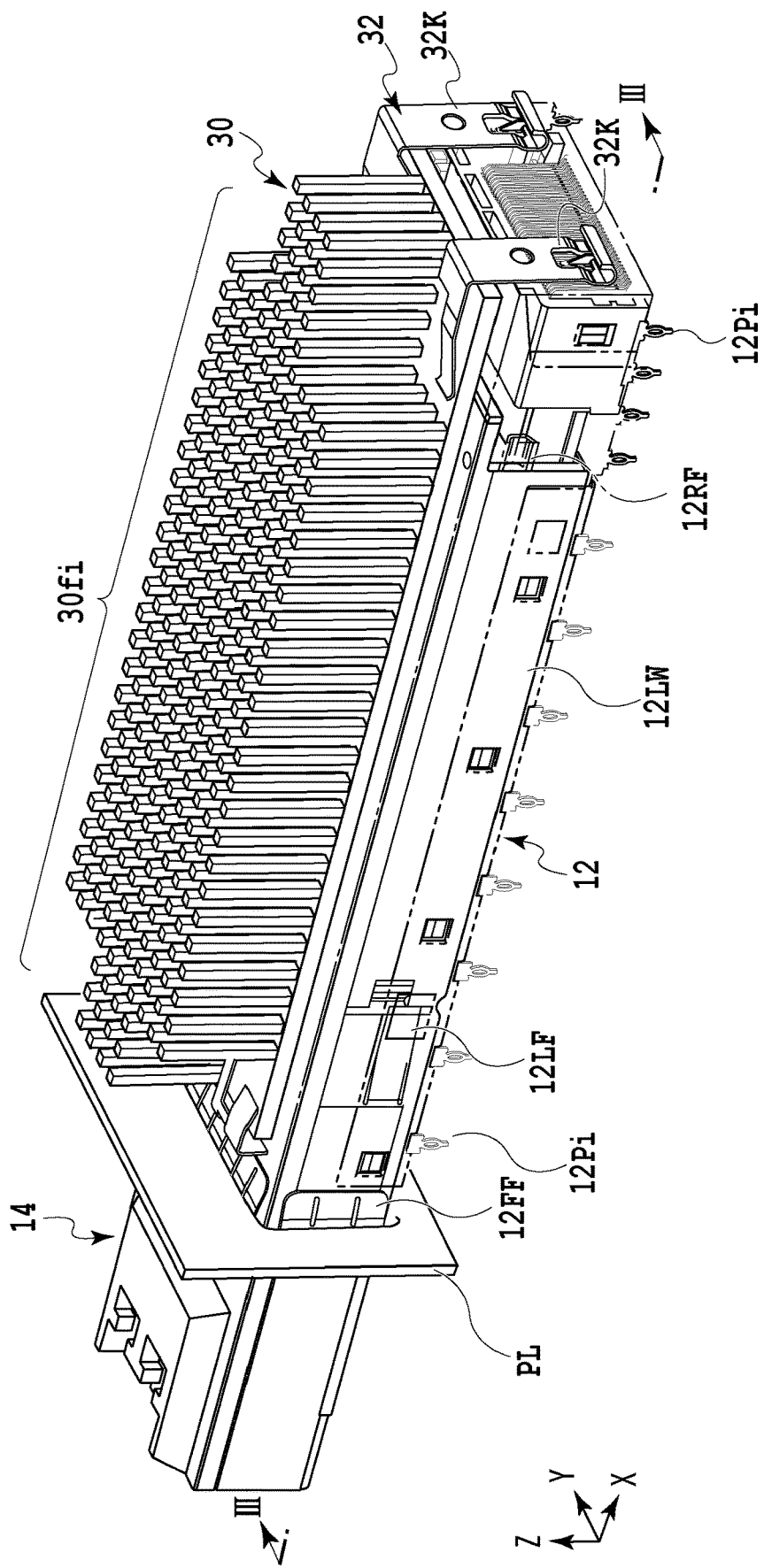
FIG. 2A is a perspective view showing external appearance of the example of the transceiver module assembly according to the present invention.
Figure 2B:
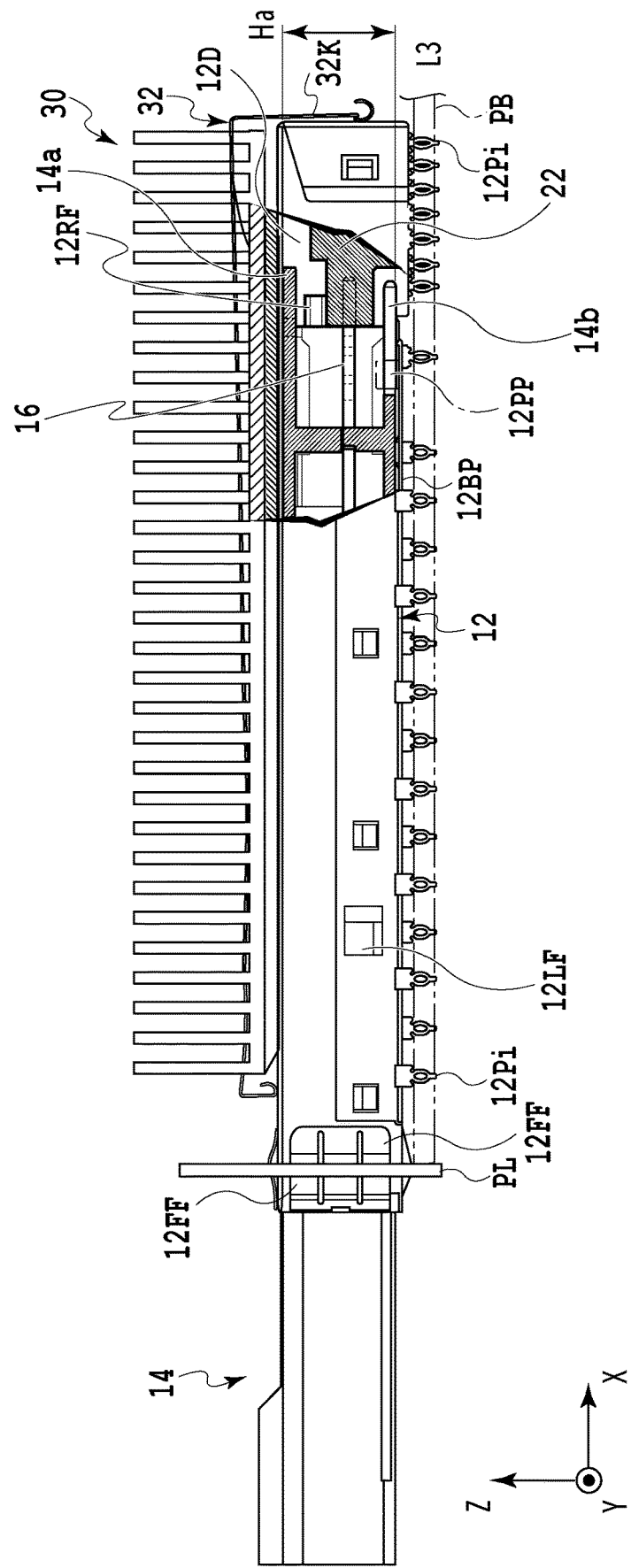
FIG. 2B is a side view, inclusive of a partial cross-sectional view, of the example shown in FIG. 2A.

FIG. 2B shows an example of a transceiver module assembly according to the present invention together with a printed wiring board PB. Note that FIGS. 2A and 2B show a state in which a single transceiver module is representatively fitted to a transceiver module receptacle assembly.

Although illustration is omitted, a plurality of transceiver module assemblies are arranged in a line in the lateral direction or longitudinally and horizontally, for example, at given intervals in an operating side support plate PL of a casing in which the transceiver module assembly is disposed. End portions of optical modules, each of which represents an example of the transceiver module in the corresponding transceiver module assembly, project from the operating side support plate PL of the casing, respectively. A connector coupled to an end of an optical cable or of a copper cable, for example, is connected to a port provided at an end portion of each optical module. In the case of the optical cable, another end of the optical cable is coupled to an optical connector of another casing that constitutes a not-illustrated communication system.

The transceiver module assembly comprises, as its main constituents: an optical module 14 (see FIGS. 1A and 1B); an optical module receptacle assembly; and a heat sink 30.

Figure 1A:
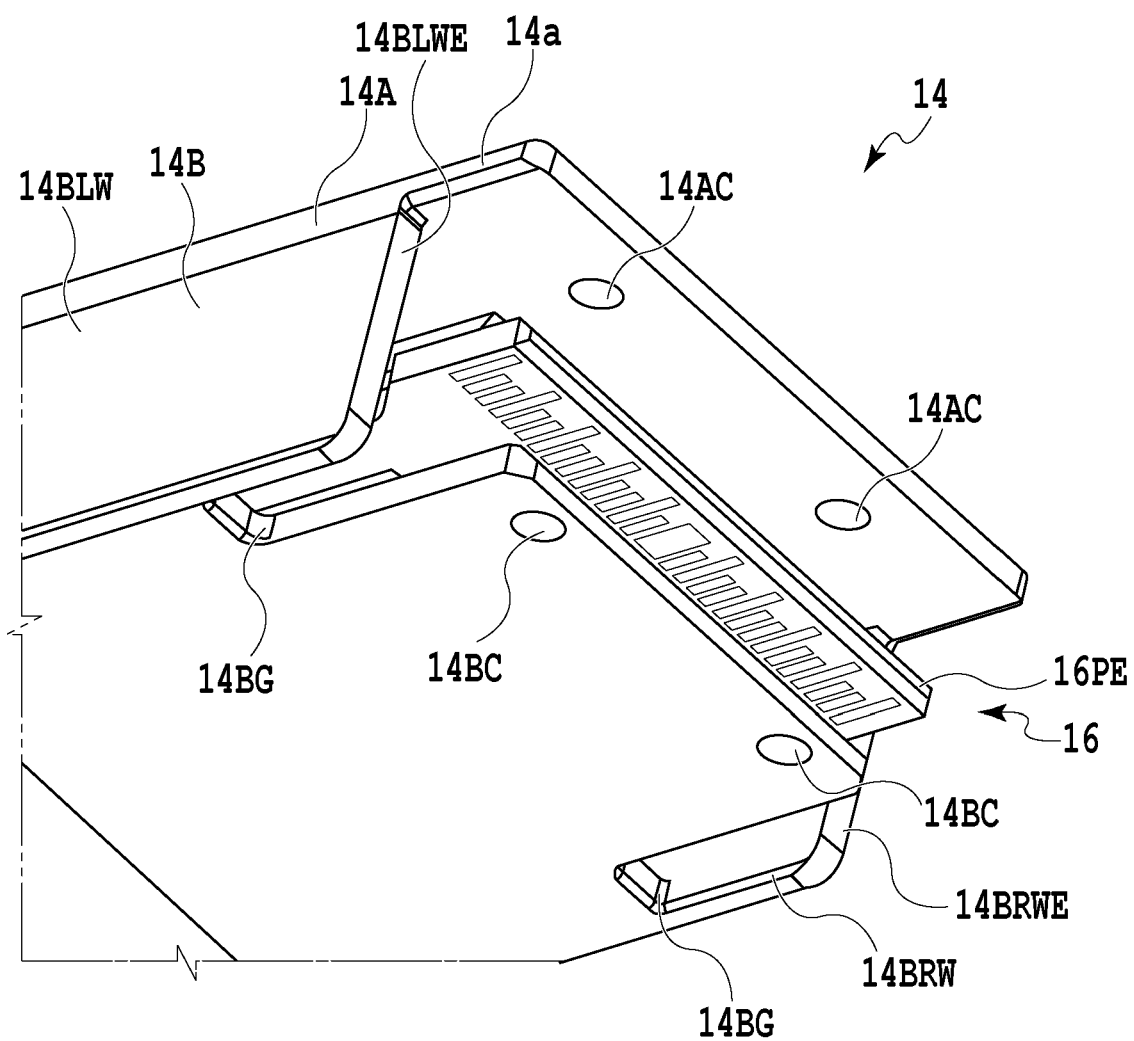
FIG. 1A is a partial enlarged perspective view of a main part of a transceiver module used in an example of a transceiver module assembly according to the present invention.
Figure 1B:
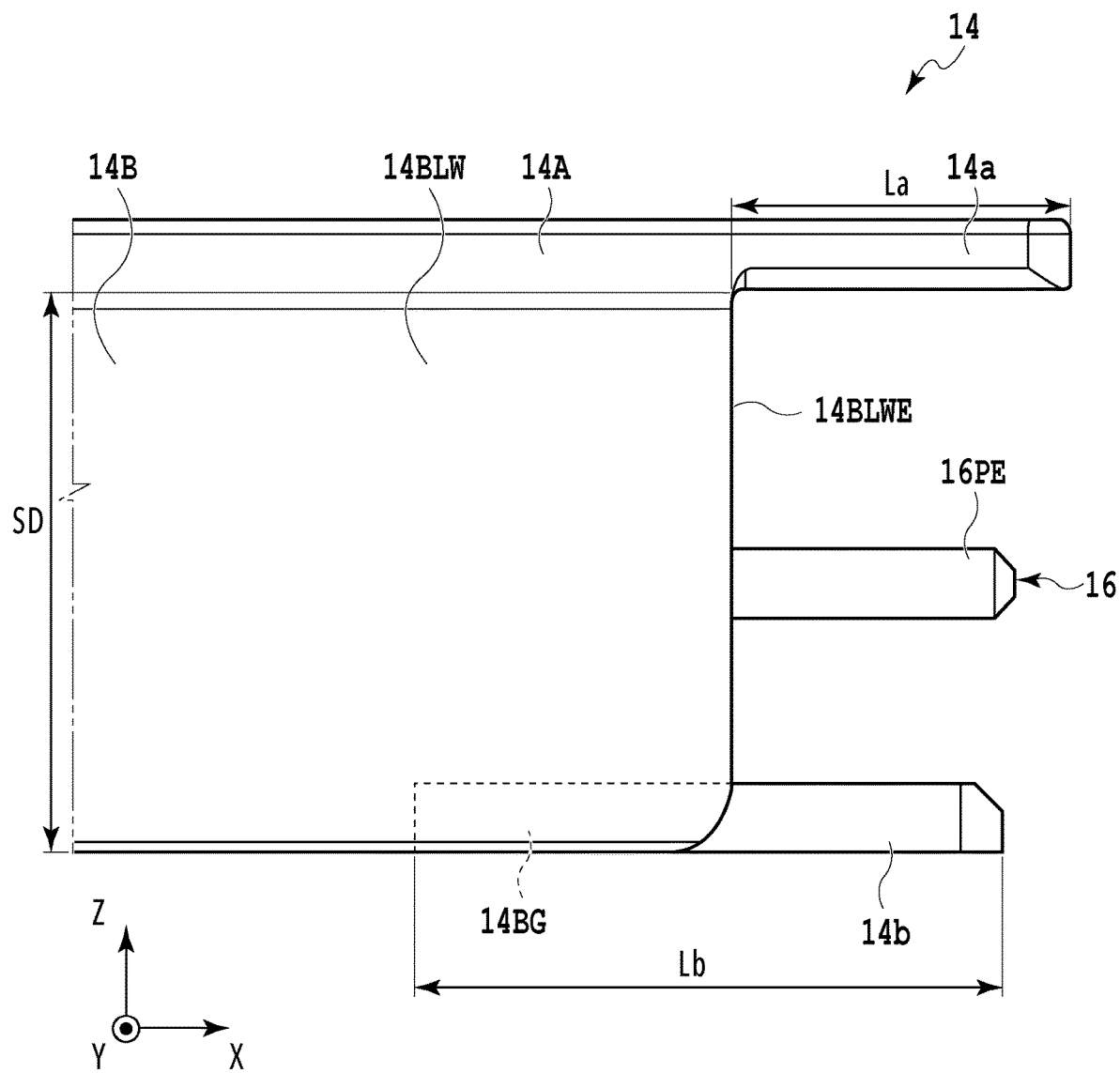
FIG. 1B is a side view of the main part of the transceiver module shown in FIG. 1A.

As shown in the partial enlarged view of FIGS. 1A and 1B, the optical module 14 includes, as its main constituents: an upper case 14A and a lower case 14B made of a metal and collectively constituting a housing of the optical module 14 as the transceiver module; and a module board as well as a plug connector 16 to be positioned at predetermined positions in an accommodating space defined between the upper case 14A and the lower case 14B.

A protection wall 14a in thin sheets being continuous with an upper surface of the upper case 14A and projecting in a longitudinal direction is formed at one end portion of the upper case 14A. The protection wall 14a extends along an X coordinate axis in an orthogonal coordinate system shown in FIG. 1B. It is to be noted that the X coordinate axis is set to be parallel to a direction of attachment and detachment of the optical module 14 to and from a receptacle cage 12 (see FIGS. 2A and 2B), while a Y coordinate axis is set to be parallel to a short side direction of the upper case 14A. A Z coordinate axis is made orthogonal to the X coordinate axis and the Y coordinate axis. The protection wall 14a is provided for protecting the plug connector 16 to be described later in case the optical module 14 is dropped by mistake. The protection wall 14a has holes 14AC provided at two positions with a given interval in between along the Y coordinate axis.

A latch mechanism (not shown) is provided at another end portion of the upper case 14A. The latch mechanism includes a release lever (not shown). When an end portion of the release lever is pulled and thus moved in a predetermined direction, a fixing piece of the release lever is detached from a lock piece 12LF of the receptacle cage 12 to be described later and is thus unlocked. On the other hand, when the release lever is moved in the opposite direction to the above-mentioned direction, the fixing piece of the release lever is fixed on the lock piece 12LF of the receptacle cage 12. Hereby, the optical module 14 is locked with the receptacle cage 12.

A protection wall 14b in thin sheets being continuous with a lower surface of the lower case 14B and projecting along the X coordinate axis is formed at a position of the lower case 14B immediately below the protection wall 14a of the upper case 14A. The protection wall 14b is formed at a position immediately below the plug connector 16 in such a way as to be substantially parallel to the protection wall 14a. The protection wall 14b has holes 14BC provided at two positions with a given interval along the Y coordinate axis. The holes 14BC are provided at positions immediately below the holes 14AC in the protection wall 14a. A thickness of each of the protection wall 14a and the protection wall 14b is set to about 1.0 mm, for example.

Each of side walls 14BLW and 14BRW of the lower case 14B forming both side portions of the optical module 14 extends for a predetermined length along the X coordinate axis. One end surface 14BLWE, 14BRWE of each of the side walls 14BLW and 14BRW is orthogonal to the protection wall 14a. A length La from a tip end surface of the protection wall 14a to each of the end surfaces 14BLWE and 14BRWE is greater than a length of projection of a connecting end portion 16PE of the plug connector 16 from opening end portions of the upper case 14A and the lower case 14B, and is set to about 4.9 mm, for example. A vertical dimension SD of each of the side walls 14BLW and 14BRW from its lower surface to a lower surface of the protection wall 14a is set to about 8.2 mm, for example.

As shown in FIG. 1A, a groove 14BG is formed between the side wall 14BLW and one of side surfaces of the protection wall 14b. In addition, another groove 14BG is also formed between the side wall 14BRW and the other side surface of the protection wall 14b. A length Lb of each groove 14BG from its closed end portion to a tip end surface of the protection wall 14b is set to about 9.6 mm, for example. When the optical module 14 is loaded into a predetermined position in the receptacle cage 12 to be described later, the closed end portions of the grooves 14BG come into contact with positioning pieces 12PP of the receptacle cage 12 as shown in FIG. 2B. Although illustration is omitted, a plurality of ports to which optical connectors are connected are formed in the other end portions of the upper case 14A and the lower case 14B.

One end portion serving as a connecting end portion of the module board is inserted into and connected to the plug connector 16 to be described later. Electrode portions each comprised of a plurality of contact pads are formed at predetermined positions on a top surface and a bottom surface of the module board in such a way as to be opposed to one another.

The plug connector 16 is integrally molded by using a resin material, for example. As shown in the enlarged view of FIGS. 1A and 1B, the plug connector 16 comprises the connecting end portion 16PE, a board support portion being continuous with the connecting end portion 16PE and supporting the one end portion of the module board; and a plurality of contact terminals (not shown) to be supported by the connecting end portion 16PE and by the board support portion. A leading end of the connecting end portion 16PE is formed substantially into a cusped cross-sectional shape. As shown in FIG. 2B, the connecting end portion 16PE is configured to project from the opening end portions of the upper case 14A and the lower case 14B and to be inserted into a slot of a host connector 22 to be described later.

The above-described contact terminals are disposed on an upper surface of the connecting end portion 16PE opposed to a pair of positioning portions of the board support portion, while providing a predetermined interval so as to correspond to the aforementioned contact pads.

As shown in FIG. 2B, the optical module receptacle assembly comprises, as its main constituents: the receptacle cage 12 provided on the printed wiring board PB and configured to attachably and detachably accommodate the above-described optical module 14; and the host connector 22 to be accommodated in a host connector accommodating portion 12D of the receptacle cage 12.

The receptacle cage 12 is made of a thin sheet of stainless steel or phosphor bronze, for example, or preferably the stainless steel with good heat conductivity and is formed by press working. The receptacle cage 12 has a module accommodating portion 12A and the host connector accommodating portion 12D which are provided inside the receptacle cage 12.

The module accommodating portion 12A is formed by being surrounded by side walls 12RW and 12LW opposed to each other at given spaced intervals, and a bottom wall portion 12BP thereof. The side walls 12RW and 12LW extend along the direction of attachment and detachment of the optical module 14. Each of the side walls 12RW and 12LW has the lock piece 12LF located in the vicinity of a module slot. Each lock piece 12LF is selectively engaged with the fixing piece of the corresponding release lever of the optical module 14 described above so as to establish the locked state of the above-described optical module 14 with the module accommodating portion 12A.

The module accommodating portion 12A has the open module slot located on one end that passes through an opening of the operating side support plate PL. Herewith, the optical module 14 is detachable and attachable through the operating side support plate PL and the module slot. Tubular front EMI fingers 12FF serving as a shield member are provided on the entire peripheral edge of the module slot having a substantially rectangular cross-section. Inner peripheral portions of the front EMI fingers 12FF come into contact with outer peripheral portions of the upper case 14A and the lower case 14B of the optical module 14 to be inserted. In addition, outer peripheral portions of the front EMI fingers 12FF come into contact with a peripheral edge of the opening of the operating side support plate PL, for example. Hereby, when the receptacle cage 12 is press-fitted into the opening of the operating side support plate PL, a gap between the opening of the operating side support plate PL and an outer peripheral portion of the receptacle cage 12 is shielded with the front EMI fingers 12FF made of a metal. Thus, noise is confined in the casing provided with the operating side support plate PL, and there is no risk of leakage of the noise to the outside through a gap between the outer peripheral portions of the upper case 14A as well as the lower case 14B of the optical module 14 and an inner peripheral portion of the module accommodating portion 12A.

As shown in the enlarged view of FIG. 3, stopper pieces 12RF are formed integrally and opposite to each other at given positions on inner peripheral surfaces of the side walls 12RW and 12LW of the module accommodating portion 12A, respectively.

In addition, another end of the module accommodating portion 12A opposed to the module slot communicates with the inside of the host connector accommodating portion 12D. A substantially rectangular opening (not shown) that is open along the Z coordinate axis in FIG. 2A is formed at a portion opposed to the bottom wall portion 12BP of the receptacle cage 12. Note that the X coordinate axis in each of FIGS. 2A and 2B is set to be parallel to the direction of attachment and detachment of the optical module 14 to and from the receptacle cage 12, while the Y coordinate axis therein is set to be parallel to the short side direction of the receptacle cage 12. The Z coordinate axis therein is made orthogonal to the X coordinate axis and the Y coordinate axis.

Each stopper piece 12RF is located at a given distance toward the host connector accommodating portion 12D apart from each lock piece 12LF described above and protrudes inwardly. Note that each of FIGS. 2A, 2B, and 3 illustrates only one of the stopper pieces 12RF.

A position of an end in the X coordinate axis of each stopper piece 12RF is located on a common plane to an opening end surface of the slot of the host connector 22 to be described later, and a position of an end in the Z coordinate axis direction of each stopper piece 12RF is set to a position closer to the above-described substantially rectangular opening than the peripheral edge of the slot of the host connector 22 is, and to a position away by about 1.0 mm or more from the inner peripheral edge of the opening, for example.

The host connector accommodating portion 12D open toward a surface of the printed wiring board PB is formed by being surrounded with a host connector-side closed end portion opposed to the module slot of the receptacle cage 12, an upper surface defining a peripheral edge of an opening on the host connector side, and host connector-side portions of the side walls 12RW and 12LW.

A pair of hook members to be fixed with a pair of fixing portions 32K of heat sink holders 32 are formed integrally with the receptacle cage 12 at an outer peripheral portion of the host connector-side closed end portion.

The host connector 22 comprises: a connector insulator provided with a slot into which the plug connector 16 of the optical module 14 is attachably and detachably inserted; and a plurality of contact terminals (not shown).

The contact terminals are configured to electrically connect the plug connector 16 of the optical module 14 to an electrode group (not shown) to be connected to a conductor pattern on the printed wiring board PB. Each contact terminal comprises: a movable contact portion provided with a contact portion on one end to come into contact with the corresponding contact terminal of the plug connector 16 of the optical module 14; a fixation portion provided with a fixation terminal portion on one end to be soldered and fixed to the electrode group of the printed wiring board PB; and a coupling portion to couple another end of the movable contact portion to another end of the fixation portion. The connector insulator is molded by using a resin material, for example, and has a slot which is open toward the module accommodating portion 12A. The plug connector 16 of the optical module 14 is electrically connected to the above-mentioned a plurality of contact terminals through the slot.

Pairs of hook portions for selectively holding the pairs of fixing portions 32K of the heat sink holders 32 for attaching the heat sink 30 to be described later to the receptacle cage 12 are formed integrally with the receptacle cage 12 at a peripheral edge of the aforementioned opening in a direction close to the operating side support plate PL and at a peripheral edge on a back surface side in a direction away from the operating side support plate PL, respectively. The pair of hook portions on the back surface side have fixing holes arranged in a line in the Y coordinate axis direction with a given interval corresponding to an interval of the aforementioned pair of the fixing portions 32K.

The heat sink 30 is made of a metal with good heat conductivity such as aluminum. The heat sink 30 has a plurality of fins 30fi (i=1 to n, n is a positive integer) provided at a base portion and arranged parallel to one another along the direction of attachment and detachment of the optical module 14. A lower end portion of the base portion of the heat sink 30 is formed such that the lower end portion can be inserted into the opening of the receptacle cage 12 and can come into contact with the upper case 14A of the optical module 14.

Both end portions at short sides of the bottom wall portion 12BP that couples lower ends of the side walls 12RW and 12LW to each other are in contact with the surface of the printed wiring board PB. A plurality of press-fitting nib portions 12Pi (i=1 to n, n is a positive integer) are formed at given intervals on both long sides of the bottom wall portion 12BP, respectively. The respective press-fitting nib portions 12Pi are press-fitted into fine holes (not shown) formed in the surface of the printed wiring board PB in such a way as to correspond to arrays of the press-fitting nib portions 12Pi. Hereby, a lower end surface of the receptacle cage 12 is tightly fixed to the surface of the printed wiring board PB.

In the above-described configuration, as shown in FIGS. 2B and 3, when the plug connector 16 of the optical module 14 in a normal attitude is inserted through the module slot of the receptacle cage 12 and is connected to the a plurality of contact terminals located in the slot of the host connector 22, the stopper pieces 12RF of the receptacle cage 12 come into contact with the end surface 14BRWE of the side wall 14BRW and the end surface 14BLWE of the side wall 14BLW of the lower case 14B of the optical module 14, respectively, whereby the inserted optical module 14 is held at a predetermined position. In this instance, the protection wall 14a is inserted between the stopper pieces 12RF and an upper part of the receptacle cage 12. In addition, the pair of positioning pieces 12PP being formed integrally with the bottom wall portion 12BP and projecting inwardly are brought into contact with the closed end portions of the respective grooves 14BG of the lower case 14B.

Figure 4A:
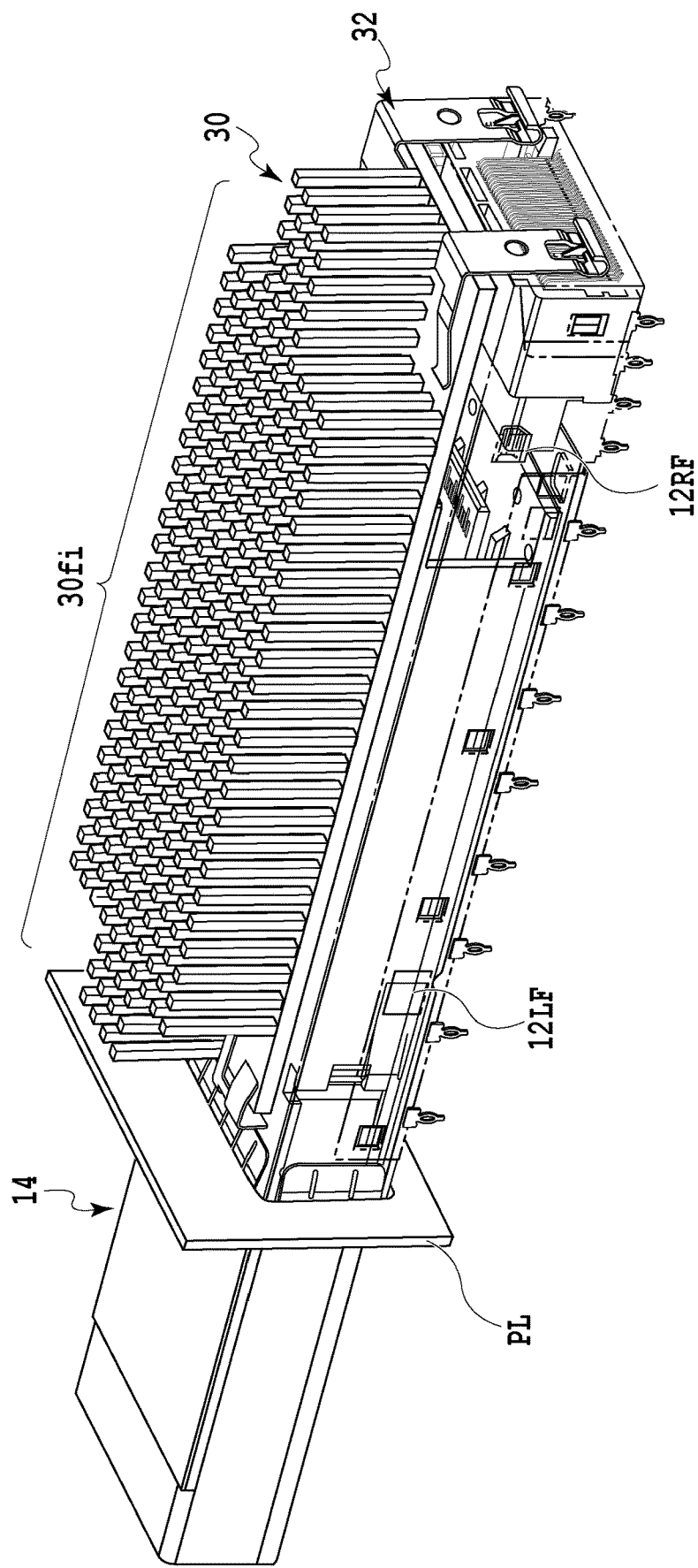
FIG. 4A is a perspective view showing external appearance of the example of the transceiver module assembly, which is made available for explaining a case in which the transceiver module is erroneously inserted into a receptacle cage.
Figure 4B:
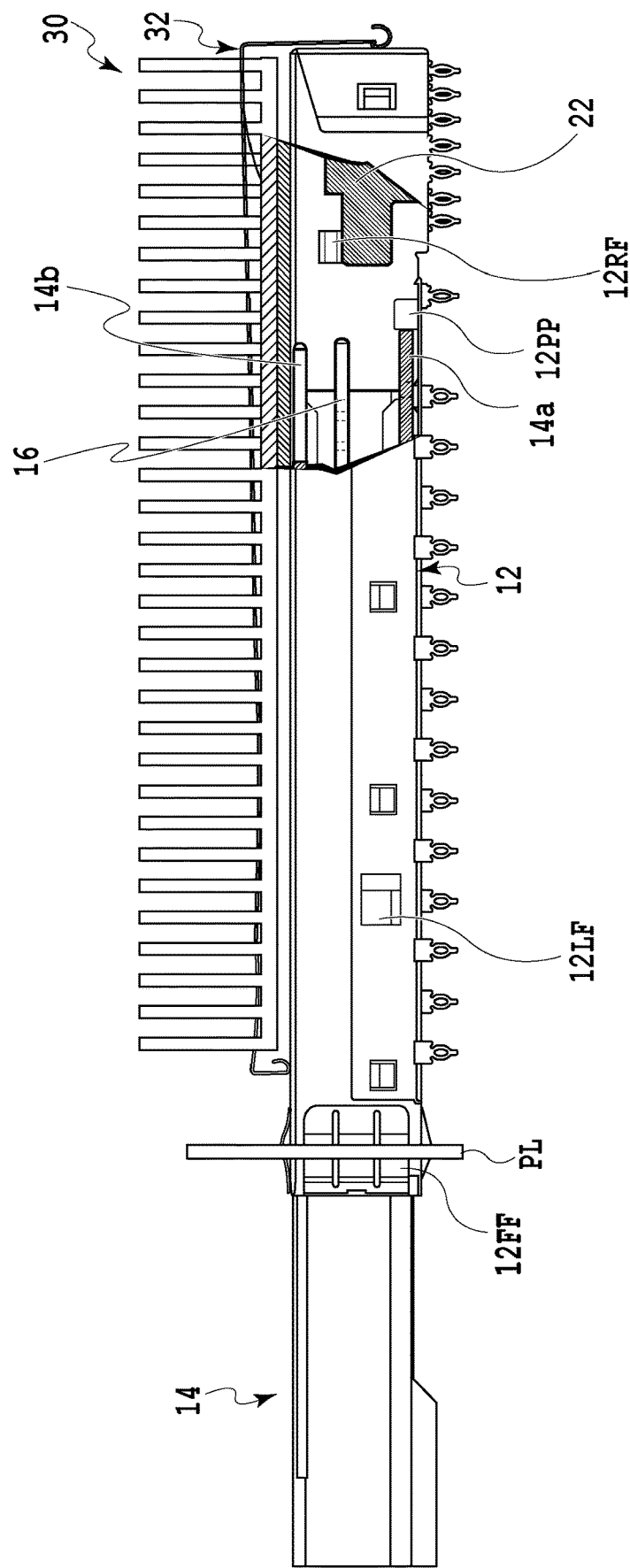
FIG. 4B is a side view, inclusive of a partial cross-sectional view, of the example shown in FIG. 4A.

On the other hand, as shown in FIGS. 4A and 4B, when the plug connector 16 of the optical module 14 is inserted in an abnormal attitude, such as a reversed attitude, through the module slot of the receptacle cage 12, because the protection wall 14a of the upper case 14A of the optical module 14 bump into the pair of positioning pieces 12PP of the receptacle cage 12, erroneous insertion of the optical module 14 is avoided in the middle of an insertion operation. As a consequence, damage of the plug connector 16 is also avoided. Note that in FIGS. 4A and 4B, the constituents of like constituents shown in FIGS. 2A and 2B will be denoted by the like reference characters and overlapping explanations thereof will be omitted.

Furthermore, when the optical module 14 is erroneously inserted into an inappropriate receptacle cage 42 (see FIGS. 5A to 5C) having an effective dimension on an inner side (hereinafter also referred to as an inside dimension) Hb being greater than an inside dimension Ha (see FIG. 2B) of the receptacle cage 12, connection of the optical module 14 to the host connector 22 is avoided as described below.

Figure 5A:
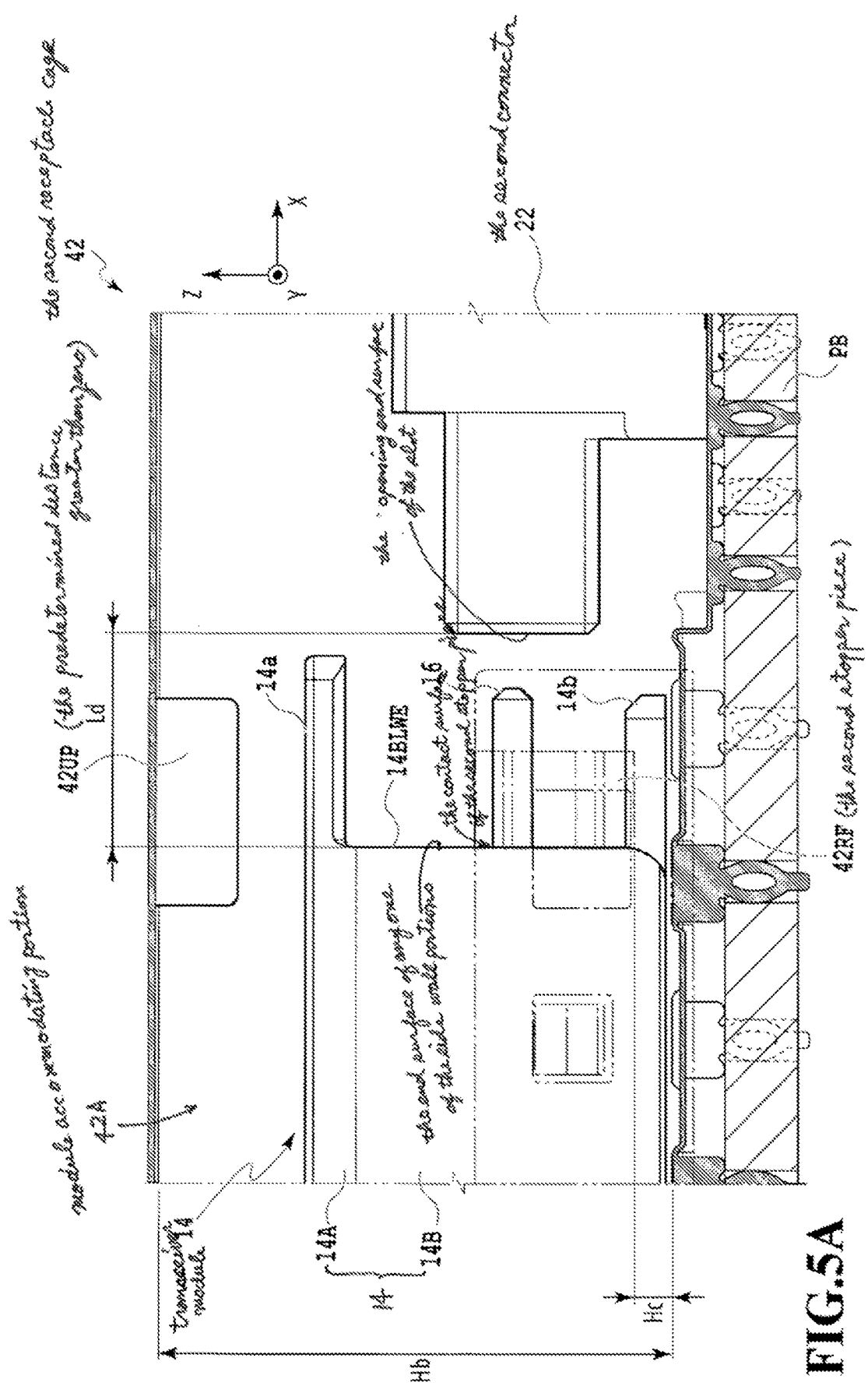
FIG. 5A is a partial cross-sectional view which is made available for explaining a case in which the transceiver module shown in FIG. 1B is inserted into another receptacle cage which is different from the receptacle cage illustrated in FIG. 2A.
Figure 5B:
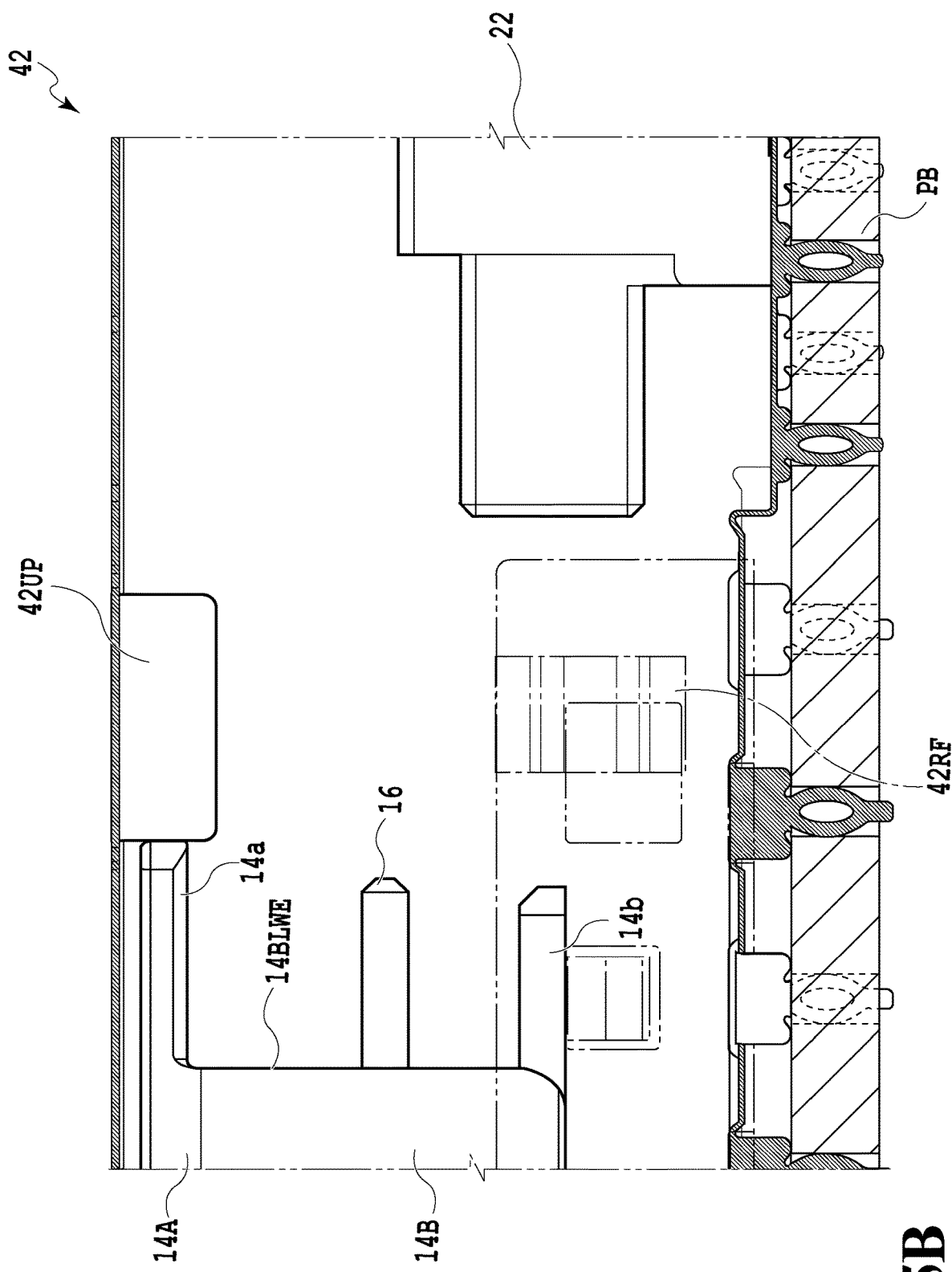
FIG. 5B is a partial cross-sectional view which is made available for explaining a case in which the transceiver module shown in FIG. 1B is inserted into still another receptacle cage which is different from the receptacle cage illustrated in FIG. 2A.
Figure 5C:
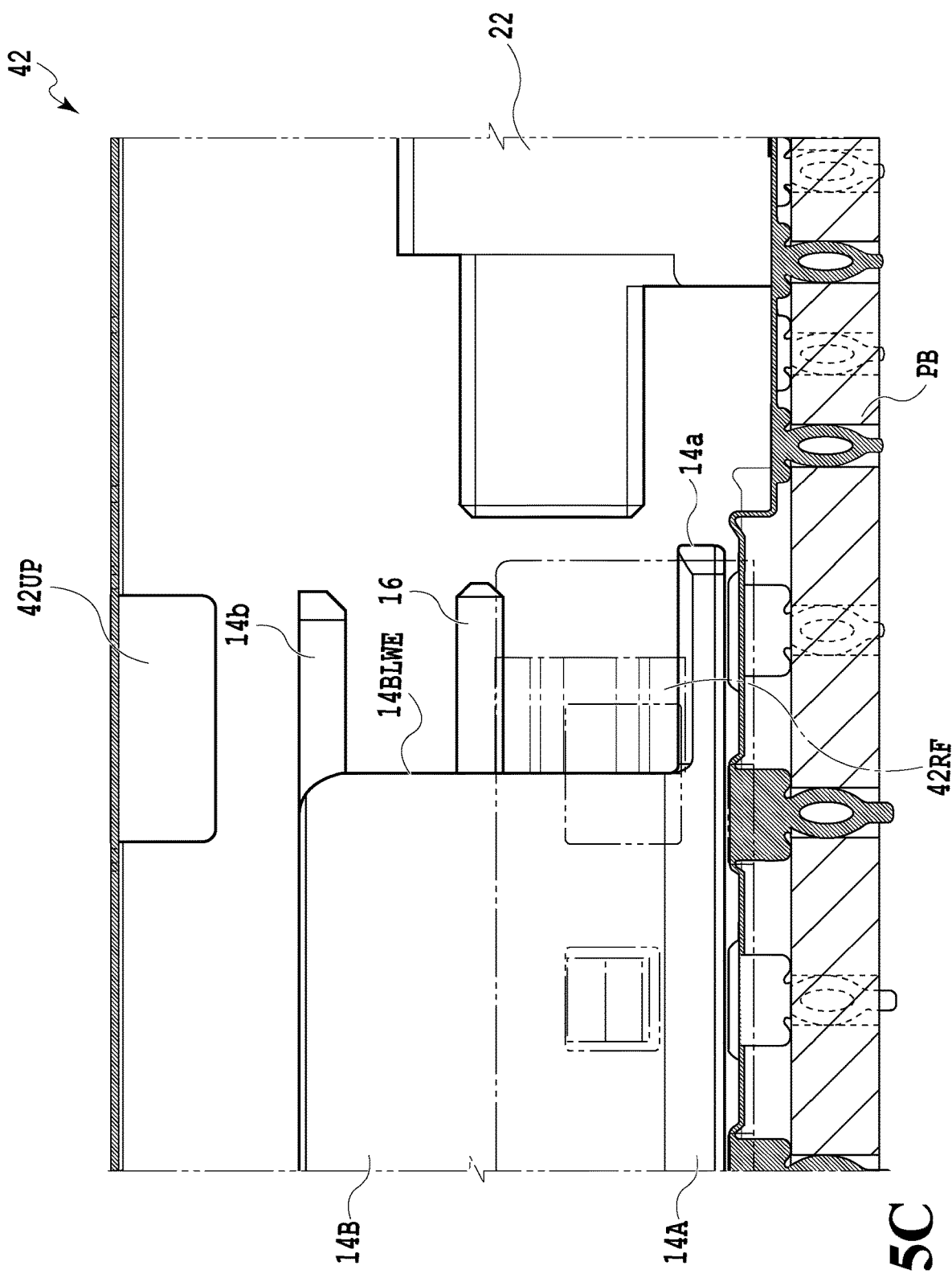
FIG. 5C is a partial cross-sectional view which is made available for explaining a case in which the transceiver module shown in FIG. 1B is inserted into yet another receptacle cage which is different from the receptacle cage illustrated in FIG. 2A.

Note that in FIGS. 5A to 5C, the receptacle cage 42 is provided with the host connector 22 located at a predetermined position and configured to allow attachment and detachment of the plug connector 16 of the optical module 14 described above, but does not include the opening on its upper part into which the lower end portion of the base portion of the heat sink 30 described above is inserted.

Where the inside dimension Hb of the receptacle cage 42 represents a length from a bottom wall portion to an inner peripheral surface of an upper wall portion along the Z coordinate axis show in FIG. 5A. The inside dimension Hb is set to be greater than the corresponding inside dimension Ha (see FIG. 2B) of the receptacle cage 12. An inside dimension of the receptacle cage 42 along the Y coordinate axis shown in FIG. 5A is set equal to a corresponding inside dimension of the receptacle cage 12. As described later, in FIGS. 5A to 5C, an interval between a contact surface of each of lower stopper pieces 42RF to come into contact with the end surface 14BLWE of the side wall 14BLW as well as the end surface 14BRWE of the side wall 14BRW of the optical module 14 and the opening end surface of the slot of the host connector 22 is set to a predetermined distance Ld. The predetermined distance Ld is set to be greater than a length of projection of the connecting end portion 16PE of the plug connector 16 from the opening end portions of the upper case 14A and the lower case 14B of the optical module 14 described above, and greater than the length La of the protection wall 14a, for example. Concerning a position of each lower stopper piece 42RF in the Z coordinate axis direction shown in FIG. 5A, a distance Hc from the bottom wall portion of the receptacle cage 42 is set to at least about 3.8 mm, for example. An upper stopper piece 42UP is integrally formed at an upper wall formed above the lower stopper piece 42RF. As described later, a position of a contact surface of the upper stopper piece 42UP to come into contact with a tip end of the protection wall 14a of the optical module 14 is set to a position closer to the module slot of the receptacle cage 42 than the position of the contact surface of the lower stopper piece 42RF described above.

In this configuration, when the plug connector 16 of the optical module 14 in the normal attitude is brought closer to the bottom wall portion and erroneously inserted through the module slot of the receptacle cage 42, such an erroneous insertion operation of the optical module 14 is interrupted in the middle of the insertion operation as the respective lower stopper pieces 42RF of the receptacle cage 42 come into contact with the end surface 14BRWE of the side wall 14BRW as well as the end surface 14BLWE of the side wall 14BLW of the lower case 14B of the optical module 14 as shown in FIG. 5A. As a consequence, damage of the plug connector 16 is also avoided.

In addition, as shown in FIG. 5B, even when the plug connector 16 of the optical module 14 in the normal attitude is brought closer to the upper wall portion and erroneously inserted through the module slot of the receptacle cage 42, the erroneous insertion operation of the optical module 14 is interrupted in the middle of the insertion operation as the upper stopper piece 42UP of the receptacle cage 42 comes into contact with the tip end of the protection wall 14a.

Moreover, as shown in FIG. 5C, when the plug connector 16 of the optical module 14 in an abnormal attitude such as a reversed attitude is brought closer to the bottom wall portion and inserted through the module slot of the receptacle cage 42, the erroneous insertion operation of the optical module 14 is interrupted in the middle of the insertion operation as the lower stopper pieces 42RF of the receptacle cage 42 come into contact with the end surface 14BRWE of the side wall 14BRW as well as the end surface 14BLWE of the side wall 14BLW of the lower case 14B of the optical module 14, respectively. As a consequence, damage of the plug connector 16 is also avoided.

Figure 6:
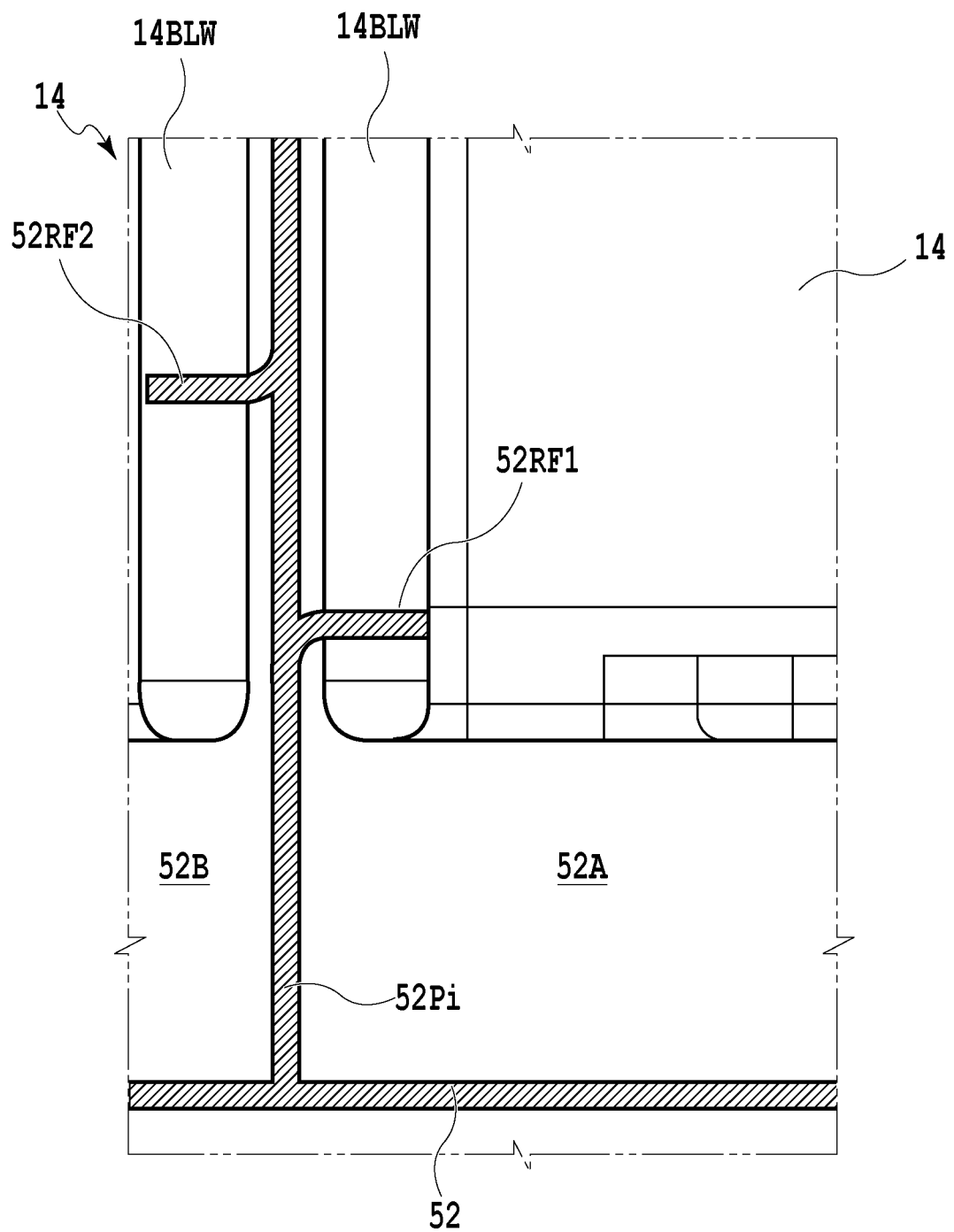
FIG. 6 is a partial cross-sectional view showing another example of stopper pieces in the receptacle cage.

It should be noted that the above-described embodiment representatively explains the example in which the single transceiver module (the optical module) is mounted to the receptacle cage provided with the single module accommodating portion and the single host connector accommodating portion. However, the above-described optical module 14 is not limited only to this example but can also deal with an inappropriate receptacle cage that includes a plurality of module accommodating portions and a plurality of host connector accommodating portions provided adjacent to one another, for instance. In this case, as shown in FIG. 6, lower stopper pieces 52RF1 and 52RF2 may be provided at a plurality of partition wall portions 52Pi (i=1 to n, n is a positive integer) that partition adjacent module accommodating portions 52A and 52B in an inappropriate receptacle cage 52 with respect to the optical module 14. The lower stopper pieces 52RF1 and 52RF2 project to the inside of the module accommodating portions 52A and 52B, respectively. Concerning a position of the lower stopper piece 52RF1, a distance from a bottom wall portion of the receptacle cage 52 may be set to at least about 3.8 mm, for example. In addition, concerning a position of the lower stopper piece 52RF2, a distance from the bottom wall portion of the receptacle cage 52 may be set to a value equal to or above the distance of the lower stopper piece 52RF1 mentioned above, for example.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:
1. A transceiver module assembly comprising:
   a transceiver module including
      a module board, and
      a housing including at least a pair of side wall portions to define an accommodating space to accommodate the module board, an upper case, and a lower case, at least one of the upper case and the lower case having an opening end portion; and
   a first receptacle cage including
      a first connector connected to a connecting end portion of the module board of the transceiver module, the connecting end portion of the module board projecting from the opening end portion in a first direction,
      a module accommodating portion having a module slot provided at one end between sidewalls forming sides of the module accommodating portion to allow passage of the transceiver module, and attachably and detachably accommodating the transceiver module,
      a connector accommodating portion communicating with the module accommodating portion and accommodating the first connector, and
      a first stopper piece provided on inner peripheral surfaces of the sidewalls of the module accommodating portion and a position of an end of the first stopper piece located on a common plane to an opening end surface of the slot of the first connector in the first direction, the first stopper piece for restricting the transceiver module to a predetermined position by coming into contact with an end surface of any one of the side wall portions of the housing of the inserted transceiver module, the end surface of any one of the side wall portions facing in the first direction and extending for a predetermined length outward, in the first direction, from the opening end portion toward the connecting end portion of the module board, the predetermined length being shorter than a distance the connecting end portion of the module board projects from the opening end portion in the first direction, wherein in a case where the transceiver module is inserted into a module accommodating portion of a second receptacle cage being different from the first receptacle cage in an inside dimension, when movement of the transceiver module is restricted by a second stopper piece provided on inner peripheral surfaces of the sidewalls forming sides of a module accommodating portion of the second receptacle cage and an interval between a contact surface of the second stopper piece to come into contact with the end surface of any one of the side wall portions of the housing of the inserted transceiver module and the opening end surface of the slot of a second connector provided in the second receptacle cage being set to a predetermined distance greater than zero in the first direction and restricting the transceiver module to a predetermined position by coming into contact with the end surface of any one of the side wall portions of the housing of the inserted transceiver module, an amount of projection of the connecting end portion of the module board projecting from the housing of the transceiver module is set to be smaller than a distance in the insertion and withdrawal direction of the transceiver module between a peripheral edge of a slot of the second connector provided in the second receptacle cage and the second stopper piece.

2. The transceiver module assembly according to claim 1, wherein the first receptacle cage has a positioning piece for coming into contact with a tip end of a protection wall of the transceiver module and restricting an insertion operation of the transceiver module when the transceiver module in a second attitude being a direction reversed from a first attitude of the transceiver module is inserted into the module accommodating portion of the first receptacle cage.

3. The transceiver module assembly according to claim 1, wherein the second stopper piece of the second receptacle cage restricts the movement of the transceiver module when the transceiver module in a second attitude being a direction reversed from a first attitude of the transceiver module is inserted into the module accommodating portion of the second receptacle cage.

4. The transceiver module assembly according to claim 1, wherein a length from a tip end surface of a protection wall formed at one end portion of the upper case to the end surface of any one of the side wall portions of the lower case is set to 4.9 mm and the length is greater than the distance the connecting end portion of the module board projects from the opening end portion in the first direction.

* * * * *